US008552721B2

(12) United States Patent
Peev et al.

(10) Patent No.: US 8,552,721 B2
(45) Date of Patent: Oct. 8, 2013

(54) HALL SENSOR ARRAY

(75) Inventors: Rumen Peev, Sofia (BG); Radostin Tsankov, Sofia (BG); Stoyan Gaydov, Sofia (BG)

(73) Assignee: Melexis Technologies NV, Tessenderlo (BE)

( * ) Notice: Subject to any disclaimer, the term of this patent is extended or adjusted under 35 U.S.C. 154(b) by 597 days.

(21) Appl. No.: 12/329,281

(22) Filed: Dec. 5, 2008

(65) Prior Publication Data

US 2009/0201017 A1 Aug. 13, 2009

(30) Foreign Application Priority Data

Dec. 7, 2007 (GB) .................................. 0723973.4

(51) Int. Cl.
*G01R 33/06* (2006.01)
(52) U.S. Cl.
USPC ........ 324/251; 324/207.2; 324/249; 327/510; 327/511
(58) Field of Classification Search
USPC ............... 324/207.2, 251, 249; 327/510, 511; 257/421, 426
See application file for complete search history.

(56) References Cited

U.S. PATENT DOCUMENTS

| 4,578,692 | A | * | 3/1986 | Higgs et al. ................... 257/420 |
| 4,709,214 | A | * | 11/1987 | Higgs ................................ 330/6 |
| 4,761,569 | A | | 8/1988 | Higgs |
| 5,406,202 | A | * | 4/1995 | Mehrgardt et al. ........... 324/251 |
| 5,541,506 | A | | 7/1996 | Kawakita et al. |
| 5,572,058 | A | | 11/1996 | Biard |
| 5,612,618 | A | | 3/1997 | Arakawa |
| 5,619,137 | A | | 4/1997 | Vig et al. |
| 5,621,319 | A | | 4/1997 | Bilotti et al. |
| 5,657,189 | A | | 8/1997 | Sandhu |
| 5,694,038 | A | | 12/1997 | Moody et al. |
| 5,831,513 | A | | 11/1998 | Lue |
| 5,844,411 | A | | 12/1998 | Vogt |
| 5,942,895 | A | | 8/1999 | Popovic et al. |
| 6,064,199 | A | | 5/2000 | Walter et al. |
| 6,091,239 | A | | 7/2000 | Vig et al. |
| 6,100,680 | A | | 8/2000 | Vig et al. |
| 6,154,027 | A | * | 11/2000 | Alexander et al. ............ 324/251 |
| 6,265,864 | B1 | | 7/2001 | De Winter et al. |
| 6,356,471 | B1 | | 3/2002 | Fang |

(Continued)

FOREIGN PATENT DOCUMENTS

| EP | 0 631 416 A2 | 12/1994 |
| EP | 0 875 733 B1 | 3/2004 |
| JP | 62048160 | 2/1987 |

OTHER PUBLICATIONS

"3235 Dual-Output Hall-Effect Switch," pp. 4-64 thru 4-67.

(Continued)

*Primary Examiner* — Arleen M Vazquez
*Assistant Examiner* — Son Le
(74) *Attorney, Agent, or Firm* — Leydig, Voit & Mayer, LLP; Gerald T. Gray

(57) ABSTRACT

A Hall sensor array has two Hall sensors arranged in opposed quadrants of a two by two array. Each Hall sensor has four contacts, arranged as two pairs of opposite contacts, the axes of each pair being substantially perpendicular.

6 Claims, 3 Drawing Sheets

(56) References Cited

U.S. PATENT DOCUMENTS

| | | | |
|---|---|---|---|
| 6,492,697 B1 * | 12/2002 | Plagens et al. | 257/426 |
| 6,768,301 B1 * | 7/2004 | Hohe et al. | 324/251 |
| 7,345,476 B2 * | 3/2008 | Middelhoek et al. | 324/251 |
| 2007/0029999 A1 * | 2/2007 | Middelhoek et al. | 324/251 |
| 2007/0046287 A1 * | 3/2007 | Vervaeke et al. | 324/251 |
| 2007/0290682 A1 * | 12/2007 | Oohira et al. | 324/251 |

OTHER PUBLICATIONS

"Sensor Signal Conditionin an IC Designer's Perceptive," *Sensors*, pp. 23-30. Nov. 1991.

Gilbert, J. "Product Description—Technical Advances in Hall-Effect Sensing," Allegro Micro Systems, Inc. pp. 1-8, May 10, 2000.

\* cited by examiner

HALL SENSOR ARRAY

CROSS-REFERENCES TO RELATED APPLICATIONS

This application claims priority to UK 0723973.4, filed Dec. 7, 2007, which is hereby incorporated by reference in its entirety for all purposes.

BACKGROUND

The present invention relates to a Hall sensor array and in particular to a Hall sensor array configured so as to minimize thermally generated offset errors.

A typical Hall element comprises a plate having two pairs of opposing contacts, the pairs of opposing contacts being arranged such that their respective axes are substantially perpendicular. The pairs of opposing contacts can be used in turn as bias contacts and readout contacts. By processing the outputs, it is possible to compensate some inherent offsets in the Hall signal.

In many implementations, to reduce the offset, a Hall sensor array comprises a pair of such Hall elements mounted side by side. Each element is operable as above but with the restriction that the pairs of opposing contacts used for biasing on each Hall element at any one time have perpendicular axes. The temperature gradient due to the mutual heating of both Hall elements caused by the side by side arrangement generates a Seebeck effect induced offset. In order to compensate this offset it is necessary to measure and process the Hall output in a four-phase cycle using each pair of opposing contacts for biasing and for readout in two directions. This therefore increases the complexity of the biasing and output processing and limits the time sensitivity of the pair of Hall elements.

It is therefore desirable to provide an improved Hall element arrangement that overcomes or alleviates the above problem.

SUMMARY

According to a first aspect of the present invention there is provided a Hall sensor array comprising a pair of Hall elements, each of the Hall elements comprising a plate having two pairs of opposing contacts, the pairs of opposing contacts being arranged such that their respective axes are substantially perpendicular wherein the pair of Hall elements are arranged at diagonally opposed corners of a square array.

This provides an arrangement wherein the inherent offset of both Hall elements including the offset caused by mutual heating due to the Seebeck effect can be fully compensated in a two-phase cycle. Furthermore the unoccupied corners of the array area can incorporate other components of an integrated circuit containing the Hall sensor array.

Preferably, the pairs of opposing contacts used for biasing on each Hall element at any one time have perpendicular axes and the adjacent corners of the Hall elements are biased by the same polarity during the different phases. Preferably each Hall element takes up substantially a whole quadrant of the array area.

In alternative embodiments, the array may comprise additional pairs of Hall elements. The additional pairs are preferably each laid out in the above manner. Preferably, such additional pairs are positioned such that adjacent Hall elements from adjacent pairs are also diagonally opposed.

According to a second aspect of the present invention there is provided a method of biasing the output of a Hall sensor array according to the first aspect of the invention characterized in that the final output is calculated over a two-phase cycle.

This provides a method wherein a four-phase cycle using each pair of opposing contacts for biasing and for readout in two directions is unnecessary and therefore decreases the complexity of the biasing and output processing and improves the time sensitivity of the pair of Hall elements.

The method of the second aspect of the present invention may incorporate any or all features of the first aspect of the present invention as desired or as appropriate.

BRIEF DESCRIPTION OF THE DRAWINGS

In order that the present invention is more clearly understood, one embodiment is described further below, by way of example only, and with reference to the accompanying drawings, in which.

DETAILED DESCRIPTION

Figure 1:
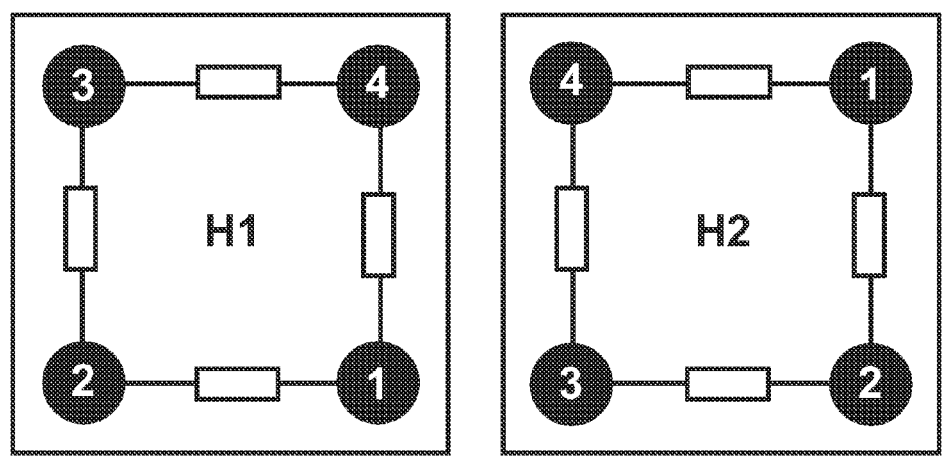
FIG. 1 is a schematic illustration of a prior art Hall sensor array incorporating a pair of Hall elements in side by side arrangement.

Turning first to the prior art sensor of FIG. 1, this comprises a pair of hall elements H1 and H2 provided side by side. Each Hall element has two pairs of opposed contacts 2,4 and 1,3 which can be used for either biasing or readout. As each Hall element H1, H2 generates heat during operation, a temperature gradient is set up across the Hall plates, the temperature being highest along the adjacent edges of H1 and H2. This being the case, a offset generated by the Seebeck effect is present in the readout Hall voltages. This offset cannot be fully compensated in a two-phase cycle. To compensate for this offset a four-phase biasing and sensing cycle is used as set out in table 1.

TABLE 1

|  | Phase 1 | Phase 2 | Phase 3 | Phase 4 |
|---|---|---|---|---|
| VDD | 1 | 4 | 3 | 2 |
| OUT+ | 2 | 1 | 4 | 3 |
| GND | 3 | 2 | 1 | 4 |
| OUT− | 4 | 3 | 2 | 1 |

As a final output can only be calculated after a full cycle, this limits the time sensitivity of a sensor of this form and increases the complexity of the biasing and output processing.

Figure 2:
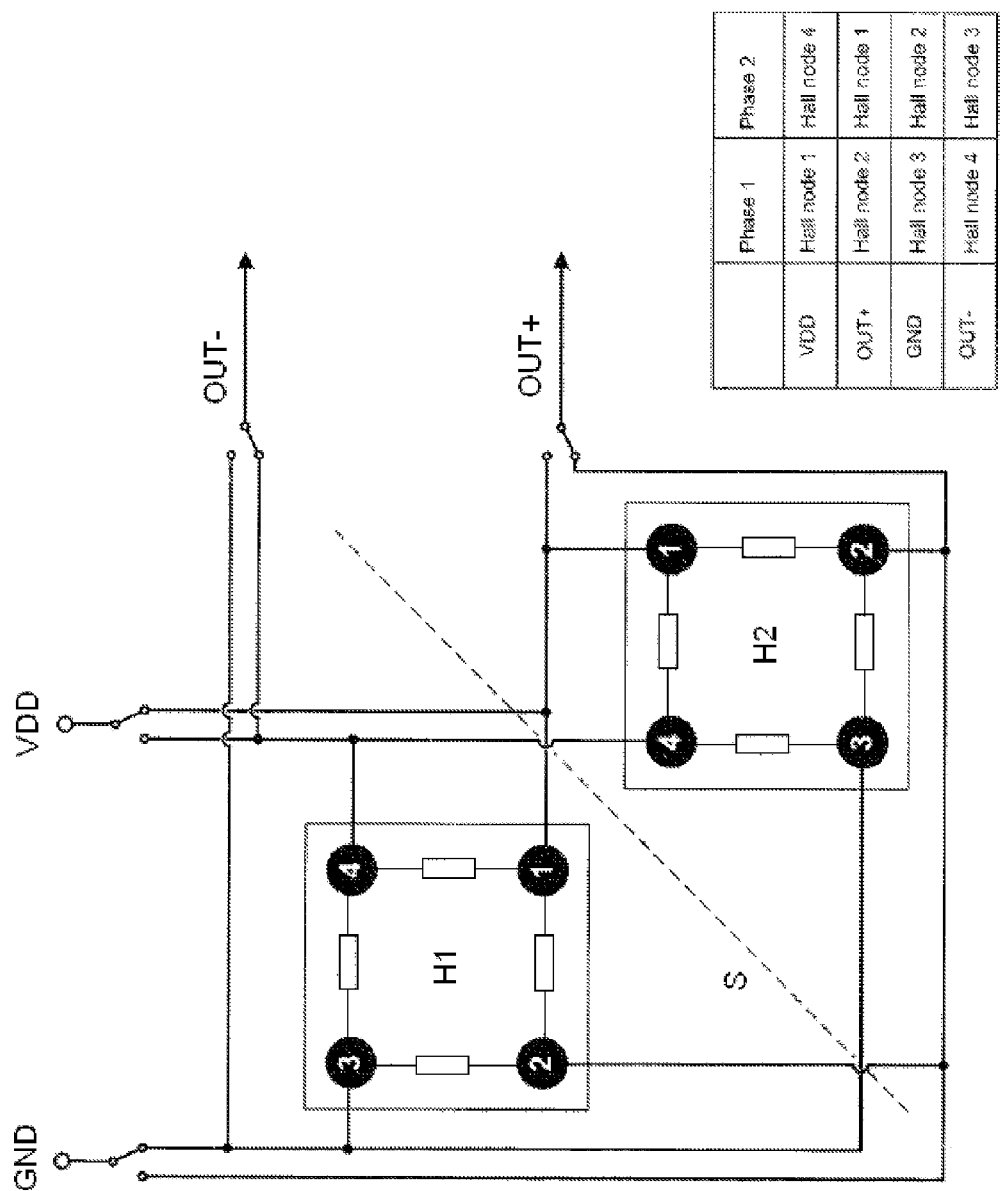
FIG. 2 is a schematic illustration of a Hall sensor array according to one embodiment incorporating a pair of Hall elements in diagonal arrangement.

Turning now to FIG. 2, a Hall sensor array according to one embodiment is shown. In this sensor, the Hall elements H1 and H2 are arranged at diagonally opposed quadrants of a two by two array. In this array, as is usual, the pairs of opposing contacts used for biasing on each Hall element at any one time have perpendicular axes. Additionally in this array, the adjacent corners of both Hall elements are biased by the same polarity during the different phases as is set out in table 2.

TABLE 2

|      | Phase 1 | Phase 2 |
|------|---------|---------|
| VDD  | 1       | 4       |
| OUT+ | 2       | 1       |
| GND  | 3       | 2       |
| OUT− | 4       | 3       |

Referring to table 2 and FIG. 2, during Phase 1 the two outputs for Hall element H1, OUT− and OUT+, are symmetrically positioned with regard to Hall element H2 and thus their contribution to the Seebeck effect induced offset is zero. For Hall element H2 output OUT− is in the closest position and output OUT+ is in the farthest position towards Hall element H1 and thus the resulting offset due to the Seebeck effect is non-zero. In contrast, in Phase 2 for Hall element H2 both outputs OUT− and OUT+ are symmetrically positioned with regard to the Hall element H1 and thus their contribution to the Seebeck effect induced offset is zero. For Hall element H1 output OUT+ is in the closest position and output OUT− is in the farthest position towards the Hall element H2 and thus the resulting offset is non-zero.

Because both Hall elements have equal shape and size the resulting offset due to mutual heating including Seebeck effect induced offset has equal amplitude in both phases. However, as the offsets generated by H1 and H2 have an opposite sign full compensation is possible when the final output is calculated over a two phase cycle using appropriate Hall signal processing.

Additionally, this means that other components can be placed in the empty quadrants, assuming that they are substantially symmetrically disposed about the axis of symmetry S, with respect to thermal properties. This allows embodiments to be implemented with an efficient use of circuit area. Such other components may include Hall sensor biasing means, processing means, other sensing means, input and/or output means or any other suitable components.

Figure 3:
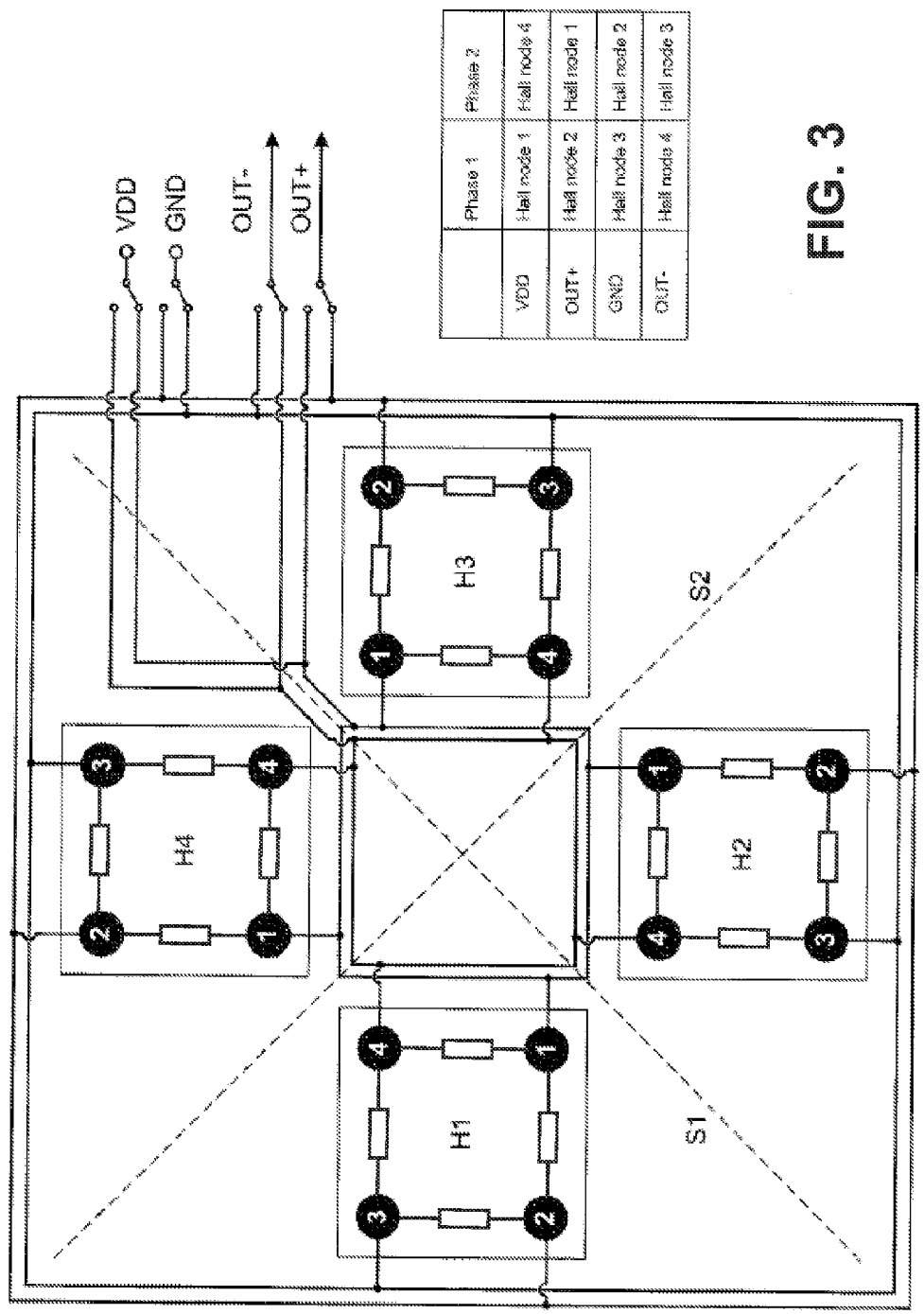
FIG. 3 is a schematic illustration of a Hall sensor array according to one embodiment invention incorporating two pairs of Hall elements in diagonal arrangement.

In an alternative embodiment, two or more pairs of Hall elements may be arranged such that each Hall element is diagonally opposed to all Hall elements adjacent to it, in a chess board like formation. This is illustrated in FIG. 3 wherein H1 and H2 form a first pair of elements and H3 and H4 form a second pair of elements, the pairs being arranged such that all the elements are diagonally opposed to their neighbors. In such an arrangement a two phase cycle can be used, the two phase cycle being the same as that used in the embodiment of FIG. 2.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A Hall sensor array consisting of a single pair of Hall elements for use in a two phase measurement cycle, each of the Hall elements comprising a plate having two pairs of opposing contacts, the pairs of opposing contacts being arranged such that their respective axes are substantially perpendicular, wherein the Hall elements in the single pair of Hall elements are arranged at diagonally opposed corners of a square array, and wherein the square array is so configured that the corresponding axes of the pairs of opposing contacts used for biasing on each Hall element at any one time are perpendicular.

2. A Hall sensor array according to claim 1, wherein adjacent corners of the Hall elements are biased by the same polarity during consecutive measurement phases.

3. A Hall sensor array according to claim 1, wherein each Hall element takes up substantially a whole quadrant of an area of the Hall sensor array.

4. A Hall sensor array according to claim 1, wherein the array comprises additional components, said additional components being disposed substantially symmetrically about a symmetry axis, said symmetry axis being perpendicular to an axis intersecting the center of each of said Hall elements in said pair.

5. A Hall sensor array comprising two or more pairs of Hall elements for use in a two phase measurement cycle, each of the Hall elements comprising a plate having two pairs of opposing contacts, the pairs of opposing contacts being arranged such that their respective axes are substantially perpendicular to those of the adjacent Hall elements,
   wherein the Hall elements in a first pair of Hall elements are arranged at diagonally opposed corners of a first square array,
   wherein the Hall elements in a second pair of Hall elements are arranged at diagonally opposed corners of a second square array, and
   wherein any two adjacent Hall elements from different pairs of Hall elements are arranged at diagonally opposed corners of an additional square array,
   wherein the additional square array is so configured that the corresponding axes of the pairs of opposing contacts used for biasing on any two adjacent Hall elements at any one time are perpendicular.

6. A Hall sensor array according to claim 5, wherein adjacent corners of adjacent Hall elements are biased by the same polarity during consecutive measurement phases.

* * * * *